US010759467B2

United States Patent
Sonoda et al.

(10) Patent No.: US 10,759,467 B2
(45) Date of Patent: Sep. 1, 2020

(54) INTEGRATED ELECTRIC POWER STEERING APPARATUS

(71) Applicant: Mitsubishi Electric Corporation, Tokyo (JP)

(72) Inventors: Isao Sonoda, Tokyo (JP); Shunsuke Fushie, Tokyo (JP); Yoshihito Asao, Tokyo (JP); Akihiko Mori, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 28 days.

(21) Appl. No.: 15/743,858

(22) PCT Filed: Sep. 18, 2015

(86) PCT No.: PCT/JP2015/076655
§ 371 (c)(1),
(2) Date: Jan. 11, 2018

(87) PCT Pub. No.: WO2017/046940
PCT Pub. Date: Mar. 23, 2017

(65) Prior Publication Data
US 2018/0201302 A1    Jul. 19, 2018

(51) Int. Cl.
*H02K 11/33* (2016.01)
*B62D 5/04* (2006.01)
(Continued)

(52) U.S. Cl.
CPC ........... *B62D 5/0406* (2013.01); *B62D 5/046* (2013.01); *H02K 11/215* (2016.01); *H02K 11/33* (2016.01);
(Continued)

(58) Field of Classification Search
CPC .. H05K 7/20509; H05K 7/20854; H02K 5/22; H02K 9/22; H02K 11/33;
(Continued)

(56) References Cited

U.S. PATENT DOCUMENTS

| 9,627,944 B2 | 4/2017 | Nakano et al. |
| 2012/0091839 A1 | 4/2012 | Hein et al. |

(Continued)

FOREIGN PATENT DOCUMENTS

| EP | 2249631 A1 | 11/2010 |
| EP | 2298622 A1 | 3/2011 |

(Continued)

OTHER PUBLICATIONS

International Search Report for PCT/JP2015/076655 dated Dec. 15, 2015.

(Continued)

*Primary Examiner* — Quyen P Leung
*Assistant Examiner* — Alexander A Singh
(74) *Attorney, Agent, or Firm* — Sughrue Mion, PLLC; Richard C. Turner

(57) ABSTRACT

Provided is an integrated electric power steering apparatus including a positive-side wiring pattern configured to connect a positive side of a power supply and a positive side of an inverter circuit and a negative-side wiring pattern configured to connect a negative side of the power supply and a negative side of the inverter circuit, in which one of the wiring patterns is formed on a central side of a wiring board and another of the wiring patterns is formed on an outer periphery side of the wiring board. A plurality of switching elements forming the inverter circuit are mounted between the positive-side wiring pattern and the negative-side wiring pattern formed on the wiring board.

13 Claims, 8 Drawing Sheets

(51) Int. Cl.
*H02K 11/215* (2016.01)
*H05K 7/20* (2006.01)
*H02M 7/00* (2006.01)

(52) U.S. Cl.
CPC ............ *H05K 7/20854* (2013.01); *H01L 2224/48247* (2013.01); *H01L 2924/13091* (2013.01); *H02M 7/003* (2013.01)

(58) Field of Classification Search
CPC ........ H02K 11/38; H02K 11/21; H02K 11/30; H02K 11/40; H02K 5/225; H02K 5/24; H02K 3/50; H02K 11/215; B62D 5/0406; B62D 5/046; H02M 7/003; H01L 2224/48247; H01L 2224/16238; H01L 2224/40229; H01L 2224/73255; H01L 2924/13091
USPC .......... 310/68 D, 68 B, 68 C, 68 E, 71, 68 R; 361/777
See application file for complete search history.

(56) References Cited

U.S. PATENT DOCUMENTS

| | | | | |
|---|---|---|---|---|
| 2012/0098391 | A1* | 4/2012 | Yamasaki | ............ B62D 5/0406 310/68 D |
| 2012/0104886 | A1* | 5/2012 | Yamasaki | ............ B62D 5/0406 310/71 |
| 2012/0313467 | A1 | 12/2012 | Omae et al. | |
| 2013/0300222 | A1* | 11/2013 | Nakano | ................... H02K 9/22 310/43 |
| 2014/0225482 | A1 | 8/2014 | Hara et al. | |
| 2015/0084570 | A1 | 3/2015 | Hara | |

FOREIGN PATENT DOCUMENTS

| | | |
|---|---|---|
| EP | 2808982 A1 | 12/2014 |
| JP | 2011-239574 A | 11/2011 |
| JP | 5316469 B2 | 10/2013 |
| JP | 2014-43122 A | 3/2014 |
| JP | 2014-154745 A | 8/2014 |
| WO | 2014/054098 A1 | 4/2014 |
| WO | 2015/122069 A1 | 8/2015 |

OTHER PUBLICATIONS

Communication from the European Patent Office dated Apr. 12, 2019, an Extended European Search Report in counterpart Application No. 15904127.6.

Communication dated Aug. 13, 2019, issued by the Intellectual Property of India in counterpart Application No. 20187007853.

Communication dated Apr. 7, 2020 from the European Patent Office in application No. 15904127.6.

\* cited by examiner

INTEGRATED ELECTRIC POWER STEERING APPARATUS

CROSS REFERENCE TO RELATED APPLICATIONS

This application is a National Stage of International Application No. PCT/JP2015/076655 filed Sep. 18, 2015, the contents of all of which are incorporated herein by reference in their entirety.

TECHNICAL FIELD

The present invention relates to an integrated electric power steering apparatus including a motor and a control unit configured to control the motor, which are integrated with each other.

BACKGROUND ART

A related-art electric power steering apparatus (see, for example, Patent Literature 1 and Patent Literature 2) includes, for example, a plurality of connectors for sensors and a power supply, an inverter circuit configured to supply a current to a motor, a control circuit including a CPU, and wirings configured to connect the components described above. In an electric power steering apparatus which adopts an integrated structure of a motor and a control unit, achievement of size reduction and weight reduction of the control unit is particularly required.

CITATION LIST

Patent Literature

[PTL 1] WO 2014/054098 A1
[PTL 2] JP 5316469 B2

SUMMARY OF INVENTION

Technical Problem

In the electric power steering apparatus described in Patent Literature 1 and Patent Literature 2, a control board, inverter circuit components forming the inverter circuit, and components such as a heat sink and a rotation. sensor are laminated between the control unit mounted on a side opposite to an output side of an output shaft of the motor and the connectors arranged on an exterior side. Further, not only the above-mentioned components but also a molded resin in which the connectors are mounted and components configured to electrically or mechanically connect the above-mentioned components are required. Further, construction for assembling the control unit requires a plurality of steps, and therefore improvement in ease of construction of the control unit is required.

Solution to Problem

The present invention has been made to solve the problems described above, and has an object to provide an integrated electric power steering apparatus which achieves size reduction and weight reduction of a control unit and improves ease of construction of the control unit.

Solution to Problem

According to one embodiment of the present invention, there is provided an integrated electric power steering apparatus, including: a motor; and a control unit which is integrated with the motor, and is configured to control the motor, the control unit including: an inverter circuit which includes a plurality of switching elements, and is configured to convert DC power supplied from a power supply into AC power and to supply the converted AC power to the motor by controlling each of the plurality of switching elements; a CPU configured to control each of the plurality of switching elements; and a wiring board on which the inverter circuit and the CPU are mounted, the wiring board including an inverter-circuit mounted surface on which the inverter circuit is mounted and an inverter-circuit non-mounted surface opposed to the inverter-circuit mounted surface, the wiring board including a positive-side wiring pattern configured to connect a positive side of the power supply and a positive side of the inverter circuit to each other and a negative-side wiring pattern configured to connect a negative side of the power supply and a negative side of the inverter circuit to each other, one of the positive-side wiring pattern and the negative-side wiring pattern being formed on a central side of the wiring board and another thereof being formed on an outer periphery side of the wiring board, the plurality of switching elements being mounted between the one wiring pattern and the another wiring pattern.

Advantageous Effects of Invention

According to the present invention, one wiring pattern of the positive-side wiring pattern and the negative-side wiring pattern is provided on the central side of the wiring board, whereas another wiring pattern is provided on the outer periphery side of the wiring board. The plurality of switching elements forming the inverter circuit are mounted between the positive-side wiring pattern and the negative-side wiring pattern on the wiring board. With this configuration, it is possible to provide the integrated electric power steering apparatus which achieves size reduction and weight reduction of the control unit and improves ease of construction of the control unit.

DESCRIPTION OF EMBODIMENTS

Now, an integrated electric power steering apparatus according to exemplary embodiments of the present invention are described with reference to the accompanying drawings. In the illustration of the drawings, the same components or corresponding components are denoted by the same reference symbols, and the overlapping description thereof is herein omitted. Further, the present invention is applicable to, for example, an electric power steering apparatus for a vehicle.

First Embodiment

Figure 1:
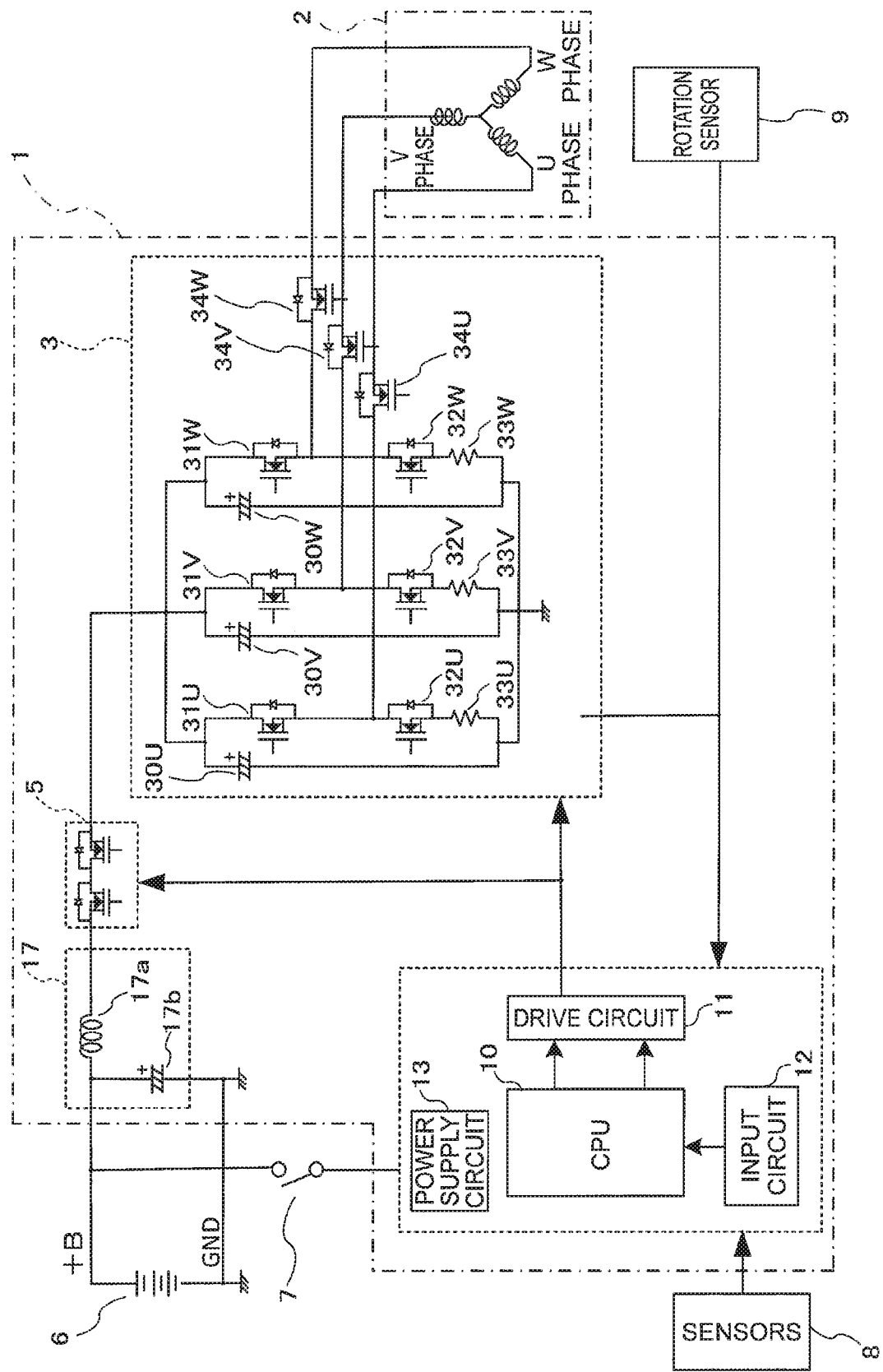
FIG. 1 is an overall circuit diagram for illustrating a circuit configuration of an integrated electric power steering apparatus according to a first embodiment of the present invention.

FIG. 1 is an overall circuit diagram for illustrating a circuit configuration of an integrated electric power steering apparatus according to a first embodiment of the present invention. The integrated electric power steering apparatus includes a motor 2 and a control unit 1 configured to control the motor 2, which are integrated with each other.

In FIG. 1, the control unit 1 includes an inverter circuit 3, a control circuit, a filter 17, and switching elements 5 for power sup (hereinafter referred to simply as "switching elements 5"), The inverter circuit 3 is configured to supply a current to the motor 2. The control circuit includes a CPU 10, a drive circuit 11, an input circuit 12, and a power supply circuit 13. The filter 17 includes a coil 17a and a capacitor 17b. The switch in elements 5 serve as power relays. The filter 17 and the switching elements 5 are examples of power supply system components which are used to connect a power supply 6 and the inverter circuit 3 to each other.

The power supply 6, an ignition switch 7, sensors 8, and a rotation sensor 9 are connected to the control unit 1. The sensors 8 include a vehicle-velocity sensor configured to detect a vehicle velocity and a torque sensor configured to detect a steering torque of a steering wheel. The rotation sensor 9 is configured to detect an angle of rotation of the motor 2. The rotation sensor 9 is arranged so that the angle of rotation of the motor 2 can be detected. For example, the rotation sensor 9 is arranged in the vicinity of an output shaft of the motor 2.

The motor 2 is a three-phase brushless motor and includes a three-phase winding including a U-phase winding, a V-phase winding, and a W-phase winding. Although the three-phase brushless motor is exemplified as the motor 2 in the first embodiment, the motor 2 may be a brushed motor or a multi-phase motor including a multi-phase winding of three or more phases.

Next, schematic description is made of operations of portions of the control unit 1. When the ignition switch 7 is turned on by a driver, a constant voltage is supplied to the CPU 10, the drive circuit 11, and the input circuit 12 by the power supply circuit 13. Further, power for the inverter circuit 3 is supplied by the power supply circuit 13 through the filter 17.

Information detected by the sensors 8 is input to the CPU 10 through the input circuit 12. The CPU 10 computes a control amount for supplying power to the motor 2 from the information input from the sensors 8. The computed control amount is output through the drive circuit 11 in an initial stage as an output information of voltages or currents of portions included in the inverter circuit 3, which are detected by using sensors and the like, and information of the angle of rotation detected by the rotation sensor 9 are input to the CPU 10 through the input circuit 12.

As the power supply 6, for example, a battery mounted to a vehicle can be used. The switching elements 5 having a relay function for opening and closing between the power supply 6 and the inverter circuit 3 are inserted into a positive-side power supply line of the power supply 6. Further, a negative-side power supply line of the power supply 6 is grounded. In the following description, a positive side of the power supply 5 is referred to as "+B side" and a negative side of the power supply 6 is referred to as "ground side". The CPU 10 controls drive of the switching elements 5 through the drive circuit 11.

The switching elements 5 are, for example, FETs. When the switching elements 5 are the FETs, a parasitic diode is provided between a source and a drain. Through provision of the switching elements 5, for example, when a failure occurs in the inverter circuit 3 or the motor 2 as a result of determination of a failure by the CPU 10, the supply of power from the power supply 6 can be forcibly interrupted. Further, through provision of the parasitic diodes, even incase of reverse connection wiring of the power supply 6, a line through which some current flows is interrupted. Specifically, the parasitic diodes also serve to protect against battery reverse connection.

The inverter circuit 3 is formed by inverter circuit components. Here, examples of the inverter circuit components forming the inverter circuit 3 may include capacitors 30, upper arm-side switching elements 31 (hereinafter simply referred to as "switching elements 31"), lower arm-side switching elements 32 (hereinafter simply referred to as "switching elements 32"), shunt resistors 33, and switching elements for motor relay 34 (,hereinafter simply referred to as "switching elements 34"). For distinction between the inverter circuit components respectively used in a U phase, a V phase, and a W phase, the components are denoted by the reference symbols followed by U, V, and W in FIG. 1, respectively.

The inverter circuit. 3 includes a U-phase circuit corresponding to the U-phase winding of the motor 2, a V-phase circuit corresponding to the V-phase winding of the motor 2, and a W-phase circuit corresponding to the W-phase winding of the motor 2. Those three circuits are connected in parallel to each other.

The U-phase circuit includes a capacitor 30U, a switching element 31U, a switching element 32U, and a shunt resistor 33U. Further, a switching element 34U having a relay function for opening and closing between the U-phase winding and the U-phase circuit is provided between the U-phase winding and the U-phase circuit.

Similarly, the V-phase circuit includes a capacitor 30V, a switching element 31V, a switching element 32V, and a shunt resistor 33V. Further, a switching element 34V having a relay function for opening and closing between the V-phase winding and the V-phase circuit is provided between the V-phase winding and the V-phase circuit.

Similarly, the W-phase circuit includes a capacitor 30W, a switching element 31W, a switching element 32W, and a shunt resistor 33W. Further, a switching element 34W having a relay function for opening and closing between the W-phase winding and the W-phase circuit is provided between the W-phase winding and the W-phase circuit.

As described above, the configurations of the U-phase circuit, the V-phase circuit, and the W-phase circuit are similar to one another. Thus, portions of the U-phase circuit are representatively described below.

The switching element 31U, the switching element 32U, and the shunt resistor 33U are connected in series. The capacitor 30U is connected in parallel to a series circuit including the switching element 31U, the switching element 32U, and the shunt resistor 33U.

Drive of the switching element 31U and the switching element 32U is controlled by a PWM method in accordance with a command from the CPU 10. Thus, the capacitor 30U is provided. in the vicinity thereof for the purpose of noise suppression. Further, the shunt resistor 33U is provided to detect a current flowing through the U-phase winding.

A voltage between the upper arm-side switching element and the lower arm-side switching element or an inter-terminal voltage of the winding of the motor 2 is input to the CPU 10 for each of the U phase, the V phase, and the W phase. Further, a voltage of the shunt resistor is input to the CPU 10 for each of the phases.

The CPU 10 computes deviations between control commands to the motor 2 and the currents flowing through the windings of the respective phases of the motor 2 and the inter-terminal voltages of the windings of the respective phases of the motor 2, and performs so-called feedback control and determination of a failure based on the result of computation. Further, the CPU 10 computes a rotational position of the motor 2 or a rotation speed of the motor 2 from the angle of rotation of the motor 2 detected by the rotation sensor 9 and also uses the result of computation for the feedback control described above.

Figure 2:
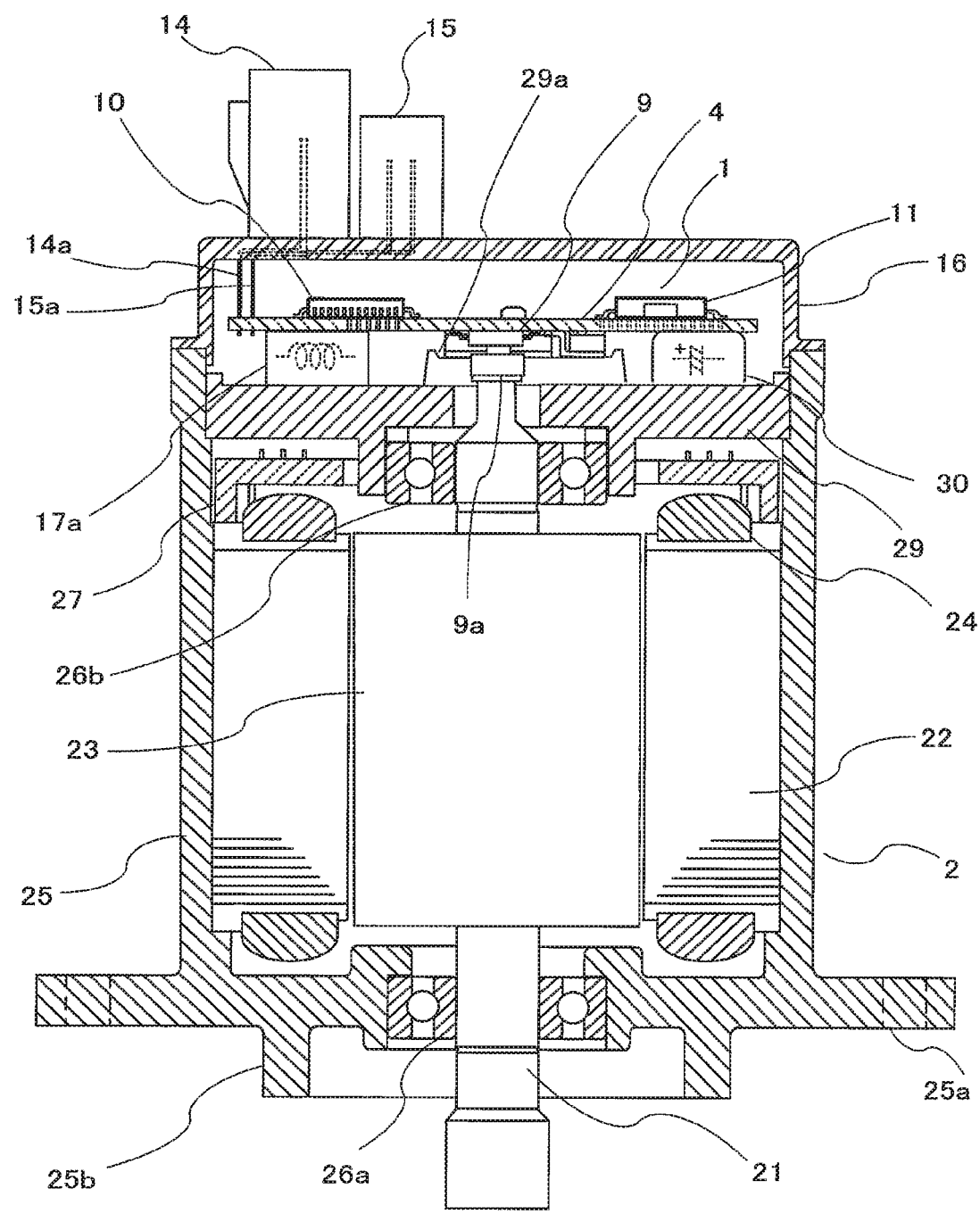
FIG. 2 is a sectional view for illustrating main parts of a structure of the integrated electric power steering apparatus according to the first embodiment of the present invention.

FIG. 2 is a sectional view for illustrating main parts of a structure of the integrated electric power steering apparatus according to the first embodiment of the present invention. In the integrated electric power steering apparatus illustrated in FIG. 2, the motor 2 is positioned on a lower side of FIG. 2, whereas the control unit 1 is positioned in an upper part of FIG. 2. The control unit 1 is integrated with the motor 2 in a state of being positioned coaxially with an output shaft 21 of the motor 2.

Here, various components described later are assembled to the motor 2. Further, the various components can be assembled to the motor 2 independently of assembly of the control unit 1. After the assembly of the various components to the motor 2 and the assembly of the control unit 1 are performed individually, the motor 2 and the control unit 1 are integrated.

The motor 2 is accommodated in a motor case 25. The motor case 25 includes a cylindrical portion having a cylindrical shape, which is integrated with a mounting-portion flange 25a and a connecting portion 25b for connection to a speed reducer (not shown) As a material of the motor case 25, for example, a metal can be used. In consideration of a heat dissipation property and an outer shape, it is preferred that, for example, aluminum be used. In a center of a lowermost portion of the motor case 25, a hole through which the output shaft 21 can pass is formed. Around the hole, a first bearing 26a configured to support the output shaft 21 is provided.

A main body portion of the motor 2 includes a rotor 23 positioned around the output shaft 21 and a stator 22 positioned apart from the rotor 23, as in the related art The rotor 23 includes permanent magnets having a plurality of poles which are provided in a circumferential direction of the rotor 23 so as to form a plurality of pole pairs.

A winding 24 is wound around the stator 22. The winding 24 wound around the stator 22 forms the three-phase winding including the U-phase winding, the V-phase winding, and the W-phase winding. An annular connection ring 27 is provided on the winding 24 to connect the windings of the respective phases. Winding end portions of the windings of the respective phases, specifically, a winding end portion of the U-phase winding, a winding end portion of the V-phase winding, and a winding end portion of the W-phase winding are drawn toward the control unit 1. A rotation sensor rotor 9a which is used for the rotation sensor 9 is provided to a counter-output side distal end of the output shaft 21.

A frame 29 is provided to an upper portion of the motor case 25 in a state of being held in contact with an inner peripheral surface of the motor case 25. As a material of the frame 29, for example, a metal can be used. In a center of the frame 29, a hole through which the output shaft 21 can pass is formed. Around the hole, a second bearing 26b configured. to support the output shaft 21 is provided.

The frame 29 serves as a partition wall configured to separate the motor 2 and the control unit 1 from each other and serves as a bearing retaining member configured to retain the second bearing 26b. Further, three holes through which the winding end portions of the windings of the respective phases are to be inserted are formed in the frame 29. The frame 29 further serves as a heat sink configured to achieve heat dissipation from the control unit 1. As described above, efforts are made to allow the frame 29 to fulfill the plurality of roles. As a result, the number of components can be reduced.

A housing 16 which is positioned above the frame 29 is provided to an uppermost portion of the motor case 25 in a state of being held in contact with the inner peripheral surface of the motor case 25. As a material of the housing 16, for example, a resin can be used.

In the control unit 1, there are mounted the inverter circuit 3, the control circuit, the filter 17, and the switching elements 5, which are described above with reference to FIG. 1, on a wiring board 4. The wiring board 4 of the control unit 1 is positioned in a space surrounded by the frame 29 and the housing 16. The wiring board 4 has an inverter-circuit mounted surface on which the inverter circuit 3 is mounted and an inverter-circuit non-mounted surface opposed to the inverter-circuit mounted surface. In the following description, the inverter-circuit mounted surface is referred to as "front surface", and the inverter-circuit non-mounted surface is referred to as "back surface".

On the front surface of the wiring board 4, various switching elements including the switching elements 5, the switching elements 31, the switching elements 32, and the switching elements 34, the capacitors 30, the shunt resistors 33, and the coil 17a are mounted.

Meanwhile, on the back surface of the wiring board 4, the control circuit, specifically, the CPU 10, the drive circuit 11, the input circuit 12, and the power supply circuit 13 are mounted. In FIG. 2, illustration of various components mounted on the front surface and the back surface of the wiring board 4 is partially omitted because of space limitation.

A projecting portion 29a having a heat-dissipating surface to be brought into contact with heat-generating components mounted on the front surface of the wiring board 4, specifically, with the various switching elements is provided on the frame 29. The heat-generating components mounted on the surface of the wiring board 4 can dissipate heat through the heat-dissipating surface the projecting portion 29a. An insulating and heat-transferrable sheet may be provided between the heat-generating components and the heat-dissipating surface of the projecting portion 29a so that the heat-generating components and the heat-dissipating surface are brought into contact with each other through the sheet.

As described above, the projecting portion 29a, which is brought into contact with each of the plurality of switching elements mounted on the wiring board 4 to allow the dissipation of heat generated from each of the plurality of switching elements, is provided to the frame 29 which separates the motor 2 accommodated in the motor case 25 and the control unit 1 from each other. Not only the projecting portion 29a but also the frame 29 itself can dissipate heat. Therefore, the heat-generating components and the frame 29 may alternatively be brought into contact with each other without providing the projecting portion 29a. Even with the configuration described above, the heat-generating components can dissipate heat. through the frame 29. Further, with the configuration described above, an insulating and heat-transferrable sheet may be provided between the heat-generating components and the frame 29 so that the heat-generating components and the frame 29 are brought into contact with each. other through the sheet.

A power supply connector 14 and sensor connectors 15 are integrated with each other in an uppermost portion of the housing 16, The power supply connector 14 is a connector to be connected to the +B side and the ground side of the power supply 6 for a high current. Further, the sensor connectors 15 are connectors to be connected to the sensors 8 and are made up of at least two types of connectors.

A plurality of connector pins are built in each of the power supply connector 14 and the sensor connector 15. Further, one end of each of the connector pins of each of the connectors is connected to a harness on a vehicle side, whereas another end thereof is drawn toward the control unit 1 as indicated by the broken line in FIG. 2.

Power supply wirings 14a are made up of at least two wirings including a +B-side wiring to be connected to the +B side of the power supply 6 and a ground-side wiring to be connected to the ground side of the power supply 6. The power supply wirings 14a are drawn downward in FIG. 2 through a top panel of the housing 16 to pass through power-supply terminal holes formed in the wiring board 4. Similarly, sensor wirings 15a are drawn downward in FIG. 2 through the top panel of the housing 16 to pass through sensor terminal holes formed in the wiring board 4.

The coil 17a and the capacitors 30 are mounted on the front surface of the wiring board 4 as described above and are positioned between the wiring board 4 and the frame 29.

Next, structures of the various switching elements mounted on the front surface of the wiring board 4 are described. In this case, the switching elements 31 are described as a representative of the various switching elements. Further, in this case, the switching elements 31 are exemplified as semiconductor switching elements, which are MOSFETs.

Figure 3:
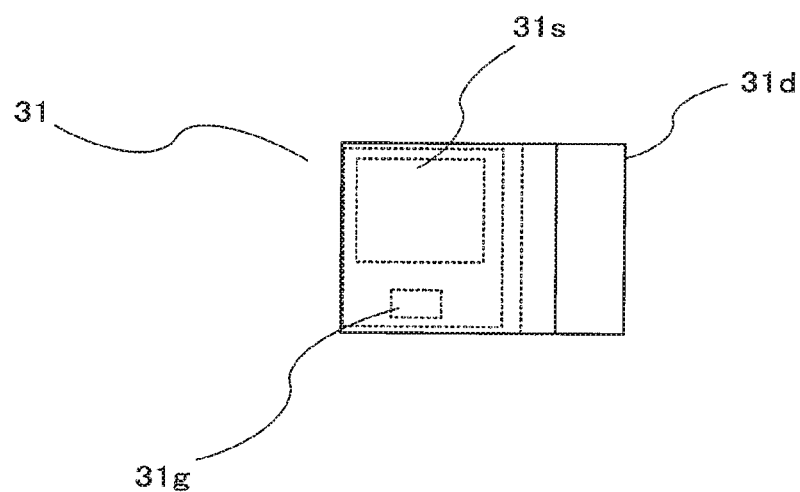
FIG. 3 is a top view of an upper arm-side switching element illustrated in FIG. 1.
Figure 4:
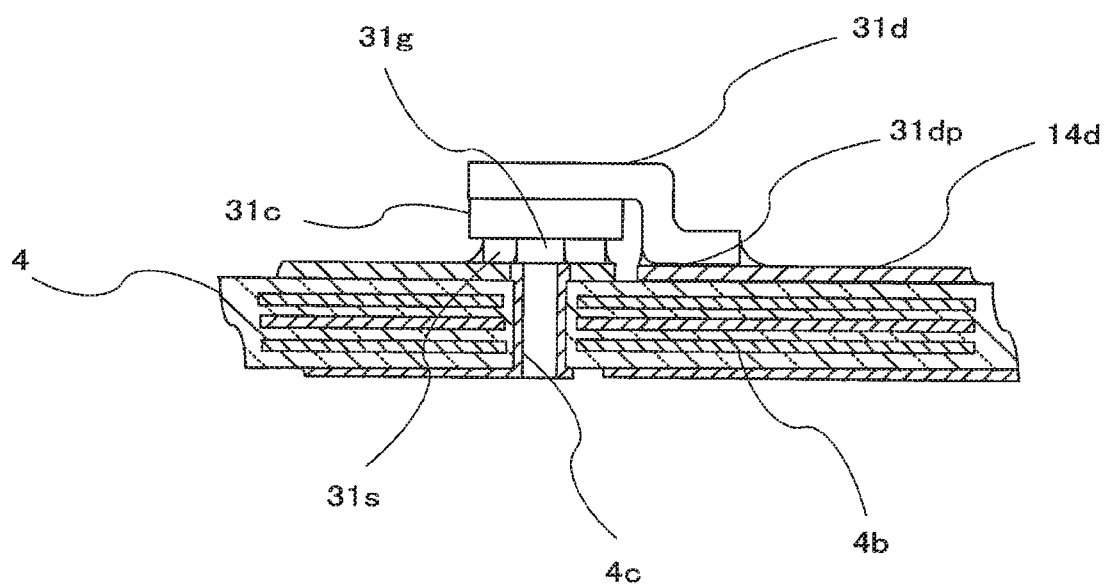
FIG. 4 is a sectional view of the upper arm-side switching element illustrated in FIG. 1.

FIG. 3 is a top view of an upper arm-side switching element 31 illustrated in FIG. 1. FIG. 4 is a sectional view of the upper arm-side switching element 31 illustrated in FIG. 1. In FIG. 4, the wiring board 4 on which the switching element 31 is mounted is illustrated together.

In FIG. 3 and FIG. 4, a chip 31c of the switching element 31 is mounted on, for example, a plate 31d made of copper. Further, a drain of the switching element 31 is directly connected to the plate 31d, and hence the plate 31d serves as a drain.

A source 31s and a gate 31g of the switching element 31 are formed in a state of projecting downward with respect to the chip 31c. A lowermost surface of the source 31s, a lowermost surface of the gate 31g, and a lowermost surface 31dp of the plate 31d are flush with one another.

As illustrated in FIG. 4, the lowermost surface of the gate 31g and the lowermost surface of the source 31s are connected to a contact pad formed on the wiring board 4 or a wiring pattern formed on the wiring board 4. The lowermost surface 31dp of the plate 31d. is similarly electrically connected to the wiring board 4 by, for example, soldering.

The wiring board 4 is a multi-layer board. A +B pattern 14d described later is formed on an uppermost surface in FIG. 4. A plurality of patterns (three patterns 4b in FIG. 4) are formed in inner layers. A pattern is similarly formed on a lowermost surface illustrated in FIG. 4. The gate 31g is connected to a via hole 4c formed in the wiring board 4 by, for example, soldering and is further connected to the drive circuit 11.

Figure 5:
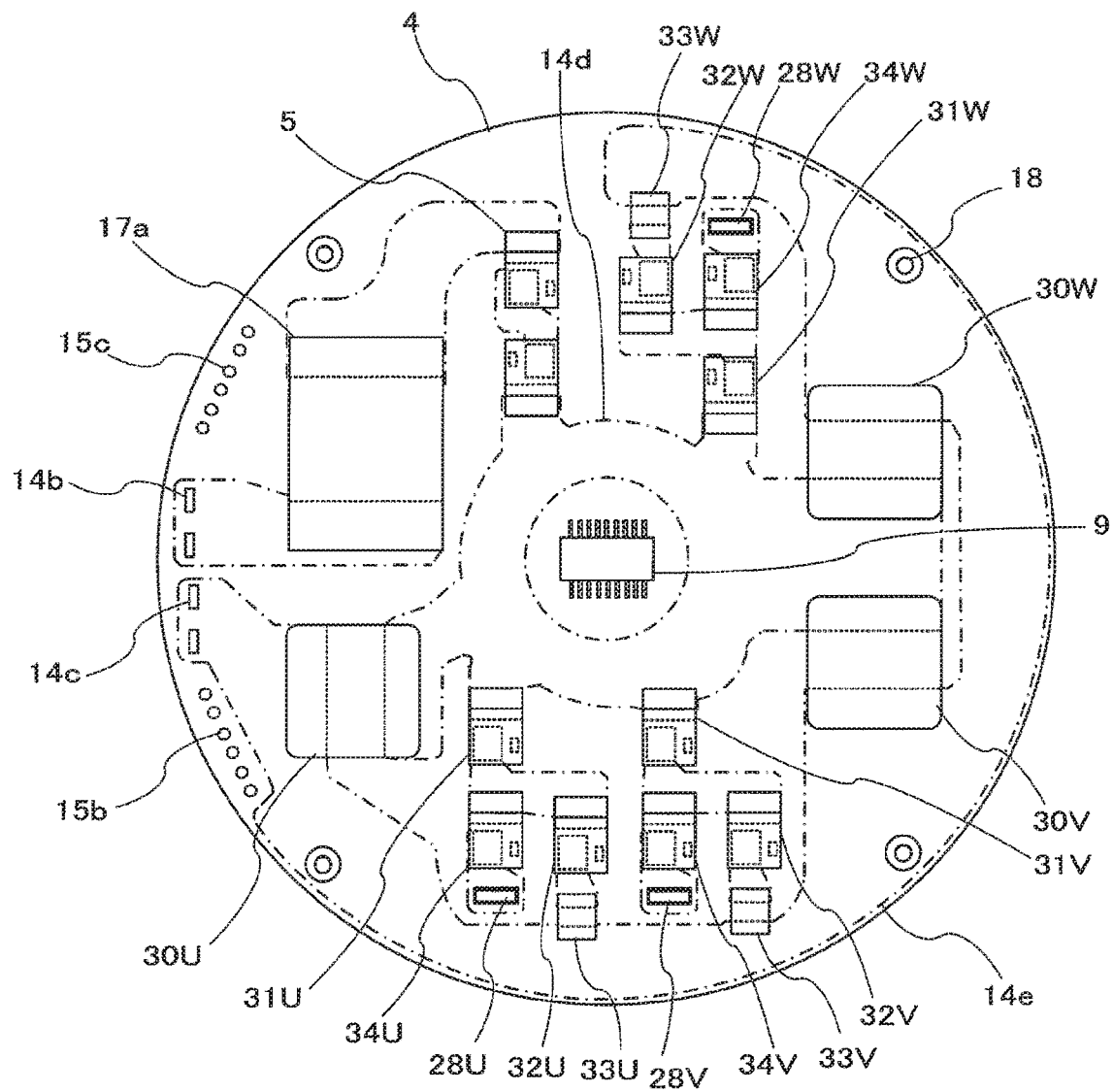
FIG. 5 is a plan view of a wiring board as viewed from a motor side of FIG. 2.
Figure 6:
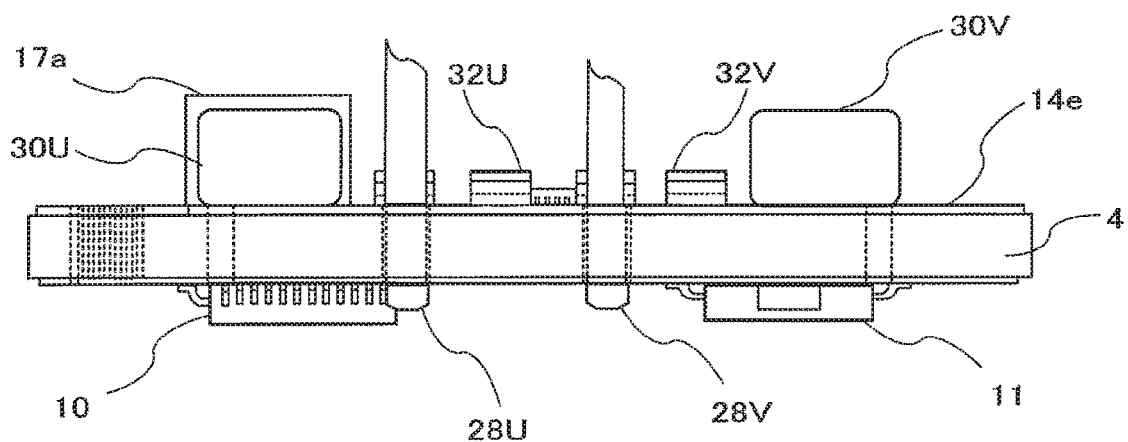
FIG. 6 is a side view of the wiring board illustrated in FIG. 3.

Next, the wiring board 4 is described. FIG. 5 is a plan view of the wiring board 4 as viewed from the motor 2 side in FIG. 2. FIG. 6 is a side view of the wiring board 4 illustrated in FIG. 5. In FIG. 5, the dashed-dotted lines indicate the wiring patterns formed on the front surface of the wiring board 4.

In this case, the wiring board 4 is a single wiring board. In the wiring board 4, a plurality of wiring patterns for electrical connection of the plurality of components to be mounted on the wiring board 4 are formed. Further, the wiring board 4 is the multi-layer board. On the front surface of the wiring board 4, there are formed the +B pattern 14d being a positive-side wiring pattern to be connected to the +B-side wiring and a ground pattern 14e being a negative-side wiring pattern to be connected to the ground-side wiring.

As is understood from the description given above, the +B pattern 14d connects the positive side of the power supply 6 and a positive side of the inverter circuit 3 to each other, whereas the ground pattern 14e connects the negative side of the power supply 6 and a negative side of the inverter circuit 3 to each other. The +B pattern 14d and the ground pattern 14e are copper-foil patterns which are thicker than the patterns formed in the other layers of the wiring board 4. With the configuration described above, the plurality of components can be efficiently connected.

On an outer periphery of the wiring board 4, terminal holes 14b and terminal holes 14c are formed as power supply terminal holes through which the power supply wirings 14a pass. The +B-side wiring included in the power supply wirings 14a passes through the terminal holes 14b, whereas the ground-side wiring thereof passes through the terminal holes 14c. The terminal holes 14b and the terminal holes 14c are respectively made up of two terminal holes in consideration of a current capacity. Through formation of the terminal holes 14b and the terminal holes 14c, the +B-side wiring included in the power supply wirings 14a can be connected to the +B-pattern 14d, whereas the ground-side wiring thereof can be connected to the ground pattern 14e.

On the outer periphery of the wiring board 4, terminal holes 15b and terminal holes 15c are formed as sensor terminal holes through which the sensor wirings 15a. pass. The terminal holes 15b and the terminal holes 15c are formed at positions apart from the terminal holes 14b and the terminal holes 14c.

The +B pattern 14d is formed so that the +B-side wiring and the coil 17a can be connected to each other. Further, the capacitor 17b is a relatively large component, and is therefore mounted on the back surface of the wiring board 4 in view of efficient use of a space on the surface of the wiring board 4. The coil 17a can also be mounted on the back surface of the wiring board 4 so that the coil 17a is positioned in the vicinity of the capacitor 17b.

Further, the +B pattern 14d is formed so that the two switching elements 5 which are positioned adjacent to the coil 17a on the front surface of the wiring board 4 can be connected in series and the coil 17a and the switching elements 5 can be connected in series. The FETs illustrated in FIG. 3 and FIG. 4 referred to above are used as the switching elements 5.

Further, the pattern 14d is formed in an annular fashion on a central side of the wiring board 4 so that the switching elements 5 and the inverter circuit 3 can be connected. In a center of a portion inside the +B pattern 14d formed in the annular fashion, specifically, in the center of the wiring board 4, the rotation sensor 9, more specifically, an IC for the rotation sensor 9 is mounted.

Here, as illustrated in FIG. 2 referred to above, it is required that the rotation sensor 9 be provided at a position opposed to the rotation sensor rotor 9a. Further, when noise is mixed into the rotation sensor 9, the angle of rotation cannot be precisely detected. As a result, the rotor 23 cannot be rotated precisely. Therefore, efforts are needed so as to prevent noise from being mixed into the rotation sensor 9. The components which most affect the rotation sensor 9 as a noise source are the switching elements configured to turn on and off a high current and wiring terminals of the motor, which are connected to the switching elements.

Based on the description given above, there is adopted a structure in which the rotation sensor 9 and the rotation sensor rotor 9a are covered with a metal wall so as to be surrounded thereby. As a result, the mixture of noise into the rotation sensor 9 can be prevented.

Further, through formation of the ground pattern 14e and the +B pattern 14d which surround the rotation sensor 9 on the front surface of the wiring board 4, the mixture of noise into the rotation sensor 9 can be prevented.

As illustrated in FIG. 5, the rotation sensor 9 is provided inside the +B pattern 14d. An upper surface of the rotation sensor 9 is flush with an upper surface of the ground pattern 14e and an upper surface of the +B pattern 14d.

The ground pattern 14e is formed along the outer periphery of the wiring board 4. Further, the ground pattern 14e is formed on an outer side of the +B pattern 14d formed in the annular fashion. The ground pattern 14e is connected to negative-side terminals of the capacitors 30U, 30V, and 30W and is further connected to negative-side terminals of the shunt resistors 33U, 33V, and 33W.

As illustrated in FIG. 5, the inverter circuit components forming the inverter circuit 3 are provided between the +B pattern 14d and the ground pattern 14e. In particular, the capacitors 30 included in the inverter circuit components are provided across the +B pattern 14d and the ground pattern 14e.

Further, in each of the phases of the inverter circuit 3, the switching elements corresponding to the switching element 31, the switching element 32, and the switching element 34 are oriented in the same direction. As a result, lengths of the wiring patterns which connect the switching elements become the shortest.

The ground pattern 14e is formed on the outer periphery side of the wiring board 4 and is formed in parallel to the +B pattern 14d. Further, the ground pattern 14e is formed not only so as to prevent the mixture of noise but also so as to be thick with the shortest wiring length.

Rectangular holes for connection between the winding end portions 28 of the motor 2 and the switching elements 34 are formed in the wiring board 4 for the respective phases of the inverter circuit 3. In FIG. 5, the winding end portions 28 are denoted respectively by the reference symbols 28U, 28V, and 28W for distinction among the winding end portions 28 of the respective phases.

In each of the phases of the inverter circuit 3, after the winding end portion 28 is inserted into the rectangular hole formed in the wiring board 4, the winding end portion 28 and the switching element 34 are connected by, for example, soldering With the configuration described above, a connection component, for example, a component such as a terminal is not required to be used for the connection between the winding end portion 28 and the switching element 34 in each of the phases.

Further, in each of the phases of the inverter circuit 3, the winding end portion 28 is inserted through the hole formed in the frame 29, which allows the winding end portion 28 to pass therethrough, and the rectangular hole formed in the wiring board 4. Thus, the winding end portions 28 can be easily positioned. As described above, the winding end portion 28 of the winding of each of the phases of the motor 2, which is connected to the inverter circuit 3, is arranged on the wiring board 4.

The control circuit including the CPU 10 and the drive circuit 11 is mounted on the back surface of the winding board 4. Further, low-current wiring patterns formed in the periphery of the CPU 10, through which a relatively low current flows, and a high-current wiring pattern including the +B pattern 14d and the ground pattern 14e are formed separately on the front surface and the back surface of the wiring board 4, respectively. With the configuration described above, various components can be mounted on the wiring board 4 in consideration of the heat generation and the noise.

In this case, the various switching elements are mounted on the wiring board 4 in a concentrated manner so as to be contactable with the projecting portion 29a provided on the frame 29. Further, head portions of the various switching elements are formed so as to be flush with each other. Therefore, with the configuration in which the head portions of the various switching elements are formed so as to be flush with each other as described above, the head portions of the various switching elements can be easily brought into contact with the frame or the projecting portion provided on the frame. Further, the heat dissipation property of the various switching elements can be secured, and at the same time, a space can be formed at a location on the wiring board 4, at which the switching elements are not mounted. In the space, relatively large-size components such as the capacitors 30 and the coil 17a are mounted in a dispersed manner.

The low-current wiring patterns are formed by using the inner layer of the wiring board 4 and the space on the wiring board 4, in which the high-current wiring pattern is not provided, so as to be provided therein. Four holes 18 formed in the wiring board 4 are formed so as to allow insertion of columns configured to fix the wiring board 4 to the frame 29 therethrough.

As described above, according to the first embodiment, of the positive-side wiring pattern configured to connect the positive side of the power supply and the positive side of the inverter circuit and the negative-side wiring pattern configured to connect the negative side of the power supply and the negative side of the inverter circuit, the positive-side wiring pattern is provided on the central side of the wiring board, whereas the negative-side wiring pattern is provided on the outer periphery side of the wiring board. Further, the plurality of switching elements forming the inverter circuit are mounted between the positive-side wiring pattern and the negative-side wiring pattern.

In this manner, size reduction and weight reduction of the control unit can be achieved, while ease of construction of the control unit can be improved.

Further, the plurality of components can be efficiently arranged by using the single wiring board, while the various components can be efficiently connected. Further, the high-current wiring pattern is formed on the front surface of the wiring board. Therefore, as compared to a case in which the high-current wiring pattern is formed in the inner layer of the wiring board, the heat dissipation property of the pattern itself can be improved. Further, the head portions of the various switching elements are formed so as to be flush with each other. Therefore, the head portions of the various switching elements and the frame functioning as the heat sink for heat dissipation and the projecting portion provided on the frame can be easily brought into contact with each other.

Further, the various switching elements are arranged on the wiring board in a concentrated manner. Thus, an interval between the various components is reduced. Further, the wiring pattern which connects the intervals is shortened. As a result, a current loss due to the wiring pattern can be reduced. Further, with such a configuration of enabling reduction of the current loss, a temperature rise of the wiring board and a temperature rise of the various switching elements can be prevented. As a result, operating time of the integrated electric power steering apparatus can be increased.

Second Embodiment

In a second embodiment of the present invention, in contrast to the configuration of the first embodiment described above, description is made of a case in which the +B pattern 14d and the ground pattern 14e of the wiring board 4 are interchanged. In the second embodiment, the description of the same points as those of the first embodiment is omitted, and points different from those of the first embodiment are mainly described.

Figure 7:
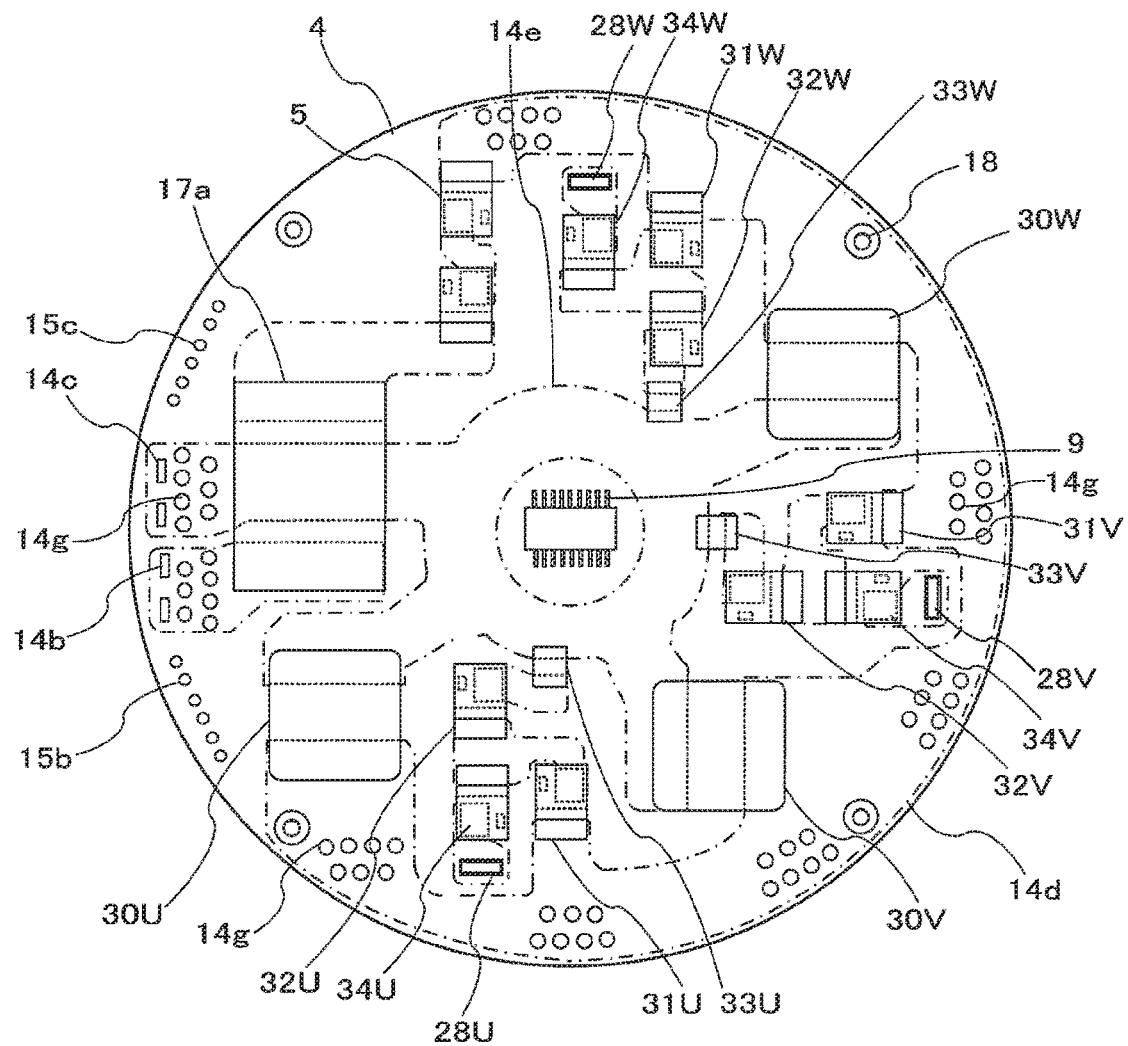
FIG. 7 is a plan view of a wiring board in a second embodiment of the present invention.
Figure 8:
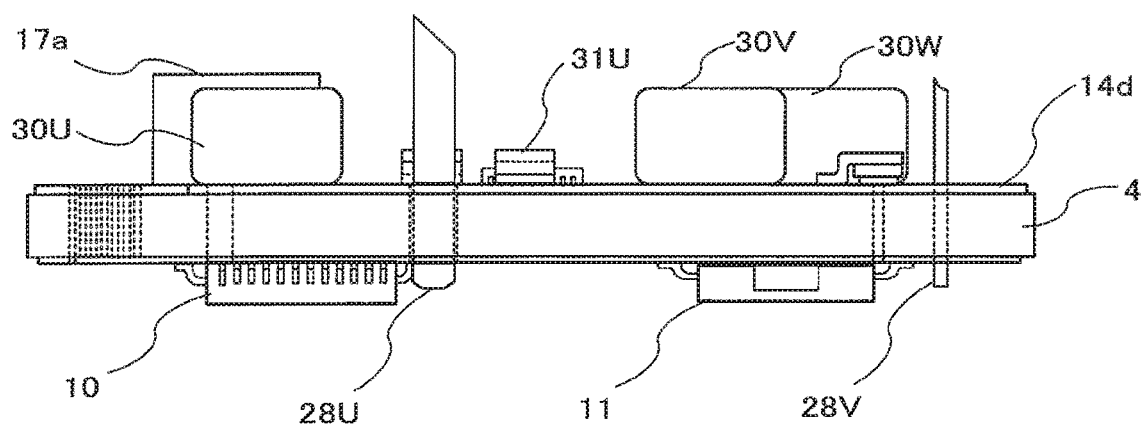
FIG. 8 is a side view of the wiring board illustrated in FIG. 7.

FIG. 7 is a plan view of the wiring board 4 in the second embodiment of the present invention. FIG. 8 is a side view of the wiring board 4 illustrated in FIG. 7. As illustrated in FIG. 7, in contrast to the wiring board 4 in the first embodiment described above, the ground pattern 14e is provided on the inner side and the +B pattern 14d is provided on the outer side on the wiring board 4 in the second embodiment.

The ground pattern 14e is annularly formed on the central side of the wiring board 4 so as to surround the rotation sensor 9. Meanwhile, the +B pattern 14d is annularly formed along the outer periphery of the wiring board 4 on the outer side of the ground pattern 14e.

Further, in contrast to the first embodiment described above, in the second embodiment, the inverter circuit components in the respective phases of the inverter circuit 3 are mounted on the wiring board 4 along a circumferential direction of the wiring board 4 and the capacitors 30 are mounted between the inverter circuit components of the respective phases. Specifically, the inverter circuit components of each of the phases are arranged in a dispersed manner over the phases.

As illustrated in FIG. 7, when the wiring board 4 has a sufficient area, the heat-generating components included in the inverter circuit components of the respective phases, specifically, the switching elements of the respective phases are arranged in a dispersed manner. As a result, effects of heat generation from the heat-generating components on each other can be eliminated. When the inverter circuit components are arranged in a dispersed manner as described above, it is required that the projecting portions 29a of the frame 29 be provided at three positions. Further, the arrangement of the inverter circuit components of the respective phases, specifically, the switching elements 31, 32, and 34 and the shunt resistor 33 in a concentrated manner rather than in a dispersed manner over the respective phases is advantageous in view of the wiring lengths of the wiring patterns, the heat dissipation property, and the arrangement of the projecting portions 29a functioning as the heat sink.

For each of the capacitors 30 and the coil 17a, two electrodes for electrical connection are arranged at both ends of the component. Further, a central portion of a main body of each of the capacitors 30 and the coil 17a is an insulating body in the form of being separated from the electrodes arranged at the both ends. Therefore, positions of the electrodes arranged at the both ends can be effectively used. As a result, each of the capacitors 30 and the coil 17a can be arranged across the +B pattern 14d and the ground pattern 14e and can be connected to those patterns The above-mentioned arrangement of the capacitors 30 and the coil 17a effectively uses an area of the wiring board 4.

A portion other than portions of connection between the +B pattern 14d and the ground pattern 14e and the various components is subjected to insulating processing by forming an insulating layer thereon. Here, insulating-layer released portions 14g are formed at a plurality of positions on the wiring board 4. Through soldering to the insulating-layer released portions 14g, improvement of the heat dissipation property and an increase in current capacity can be achieved. Therefore, through formation of the insulating-layer released portions 14g at the plurality of positions or a portion having a smaller pattern width than that at other locations on the wiring board 4, the increase in current capacity is achieved. As a result, even further size reduction of the control unit 1 can be achieved.

As described above, according to the second embodiment, in contrast to the first embodiment described above, the negative-side wiring pattern is provided on the central side of the wiring board, whereas the positive-side wiring pattern is provided on the outer periphery side of the wiring board.

In this manner, reduction in wiring length of the wiring pattern is achieved, while facilitation of abutment of the heat-generating components against the projecting portions provided on the frame functioning as the heat sink can be achieved. As a result, the size reduction of the control unit can be achieved.

Third Embodiment

In a third embodiment of the present invention, in contrast to the configurations of the first and second embodiments described above, description is made of a case in which the control circuit is mounted on the front surface of the wiring board 4. In the third embodiment, the description of the same points as those of the first and second embodiments is omitted, and points different from those of the first and second embodiments are mainly described.

Figure 9:
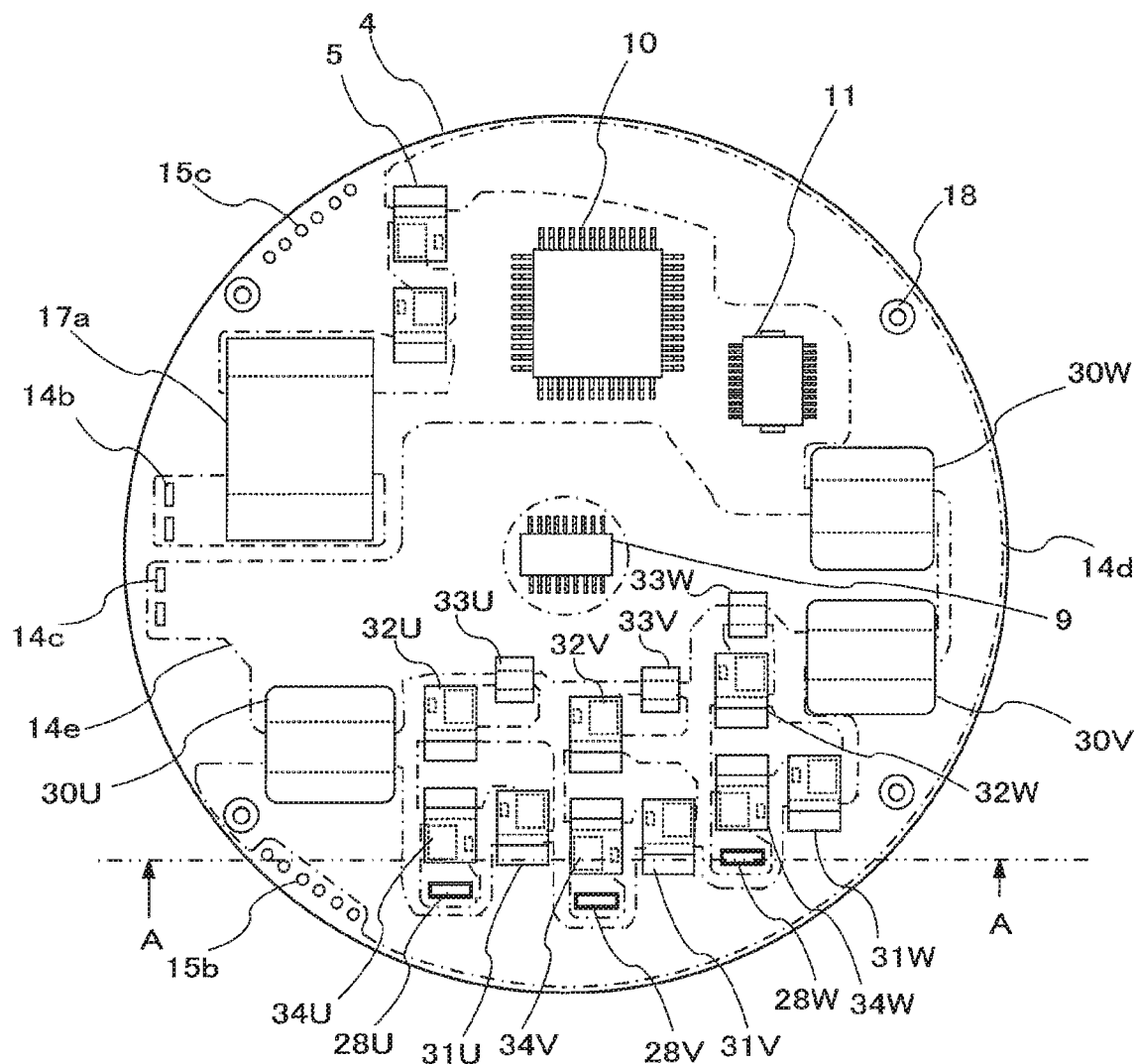
FIG. 9 is a plan view of a wiring board in a third embodiment of the present invention.
Figure 10:
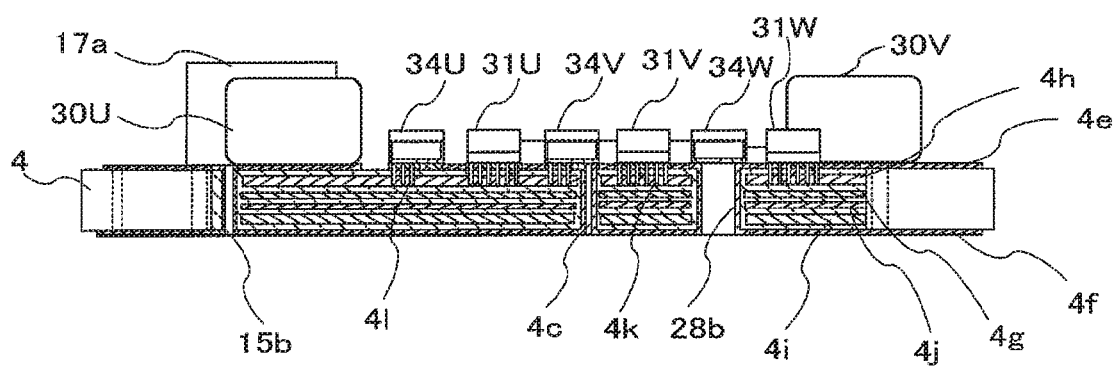
FIG. 10 is a sectional view of the wiring board as viewed from the direction of the arrows A-A of FIG. 9.

FIG. 9 is a plan view of the wiring board 4 in the third embodiment of the present invention. FIG. 10 is a sectional view of the wiring board 4 as viewed from the direction of the arrows A-A of FIG. 9. As illustrated in FIG. 9, similarly to the second embodiment described above, the ground pattern 14e is provided on the inner side and the +B pattern 14d is provided on the outer side on the wiring board 4 in the third embodiment. Meanwhile, in contrast to the second embodiment described above, the inverter circuit components of the respective phases are arranged in a concentrated manner over the respective phases on the wiring board 4 in the third embodiment without being arranged in a dispersed manner in the respective phases.

Therefore, half of the area of the wiring board 4 is occupied by the inverter circuit components of the inverter circuit 3. The switching elements 5 are mounted in a part of a space other than a space on the wiring board 4, which is occupied by the inverter circuit components. Further, the control circuit is mounted in an unoccupied portion of the space.

With the configuration described above, the area of the wiring board 4 can be effectively used, and the heat-generating components included in the inverter circuit components and the control circuit are separated from each other. Therefore, the heat dissipation property and noise immunity can be improved.

Next, with reference to FIG. 10, the wiring board 4 in the third embodiment is further described. The wiring board 4 includes a pattern layer of six layers corresponding to an outer layer 4e, an outer layer 4f, an inner layer 4g, an inner layer 4h, an inner layer 4i, and an inner layer 4j.

In the wiring board 4, four layers corresponding to the inner layer 4g, the inner layer 4h, the inner layer 4i, and the inner layer 4j are provided as inner layers. Further, in the wiring board 4, the outer layer 4e is provided on the front surface side, whereas the outer layer 4f is provided on the back surface side. A thickness of each of the inner layers 4h and 4i is larger than thicknesses of the other layers.

In the inner layer 4h, the +B pattern 14d and the ground pattern 14e illustrated in FIG. 9 are formed. In the outer layer 4e being an outermost layer, the inverter circuit components and the control circuit are mounted. In FIG. 10, the switching elements through which the high current flows, specifically, the switching elements 31V and 34U need to be connected to the high-current wiring pattern.

Therefore, in the wiring board 4, the outer layer 4e to be brought into abutment against the switching elements 31V and 34U and the inner layer 4h having the large thickness are electrically connected to each other. In order to achieve the connection described above, a plurality of through holes 4k and 4l are formed in the wiring board 4.

For the through holes 4k and 4l, in contrast to a structure of the various holes formed through the wiring board 4, for example, the terminal holes 15b and the via holes 4c which pass through the wiring board 4, a structure of a so-called blind hole is adopted.

Through provision of the high-current wiring pattern to the inner layer of the wiring board 4, the high-current wiring pattern is not directly brought into abutment against the various components mounted on the wiring board 4. As a result, as compared to the first and second embodiments, the high-current wiring pattern can be formed with the pattern width being freely increased.

Although the terminal holes 15b and the via holes 4c are sometimes connected to any of the pattern layers of the wiring board 4 for electrical connection, the terminal holes 15b and the via holes 4c are not in contact at least with the inner layer 4h. Meanwhile, a hole 28b through which the winding end portion 28 is inserted is connected to the inner layer 4h and the outer layer 4e. The two pattern layers, each having the large thickness, are arranged as the inner layers symmetrically in a thickness direction of the wiring board 4. As a result, warp of the wiring board 4 itself can be prevented.

Further, in the above-mentioned configuration, the heat dissipation property of the high-current wiring pattern is only slightly inferior to that in a case where the high-current wiring pattern is formed in the outer layer which is directly exposed to outside air As a first reason therefor, the high-current wiring pattern is not held in direct abutment against the components, and hence, in addition to the use of the blind holes, the inner layer patterns each having a large pattern width can be used. As a second reason, the pattern formed in the outermost layer is partially used. As a third reason, a thickness of the insulating layer formed on the wiring board 4 itself is extremely small.

As described above, according to the third embodiment the high-current wiring pattern having the large pattern width is formed in the inner layer of the wiring board and the blind holes are formed in the wiring board in contrast to the first and second embodiments described above. As a result, the control unit can be reduced in size without greatly reducing the heat dissipation property of the high-current wiring pattern. Further, through provision of the pattern layer having the large thickness to the inner layer, a pattern resistance can be reduced, while planarity of the wiring board itself can be easily ensured.

Fourth Embodiment

In a fourth embodiment of the present invention, in contrast to the configurations of the first to third embodiments described above, there is described a case in which two inverter circuits 3 are mounted on the wiring board 4. In the fourth embodiment, the description of the same points as those of the first to third embodiments is omitted, and points different from those of the first to third embodiments are mainly described.

Figure 11:
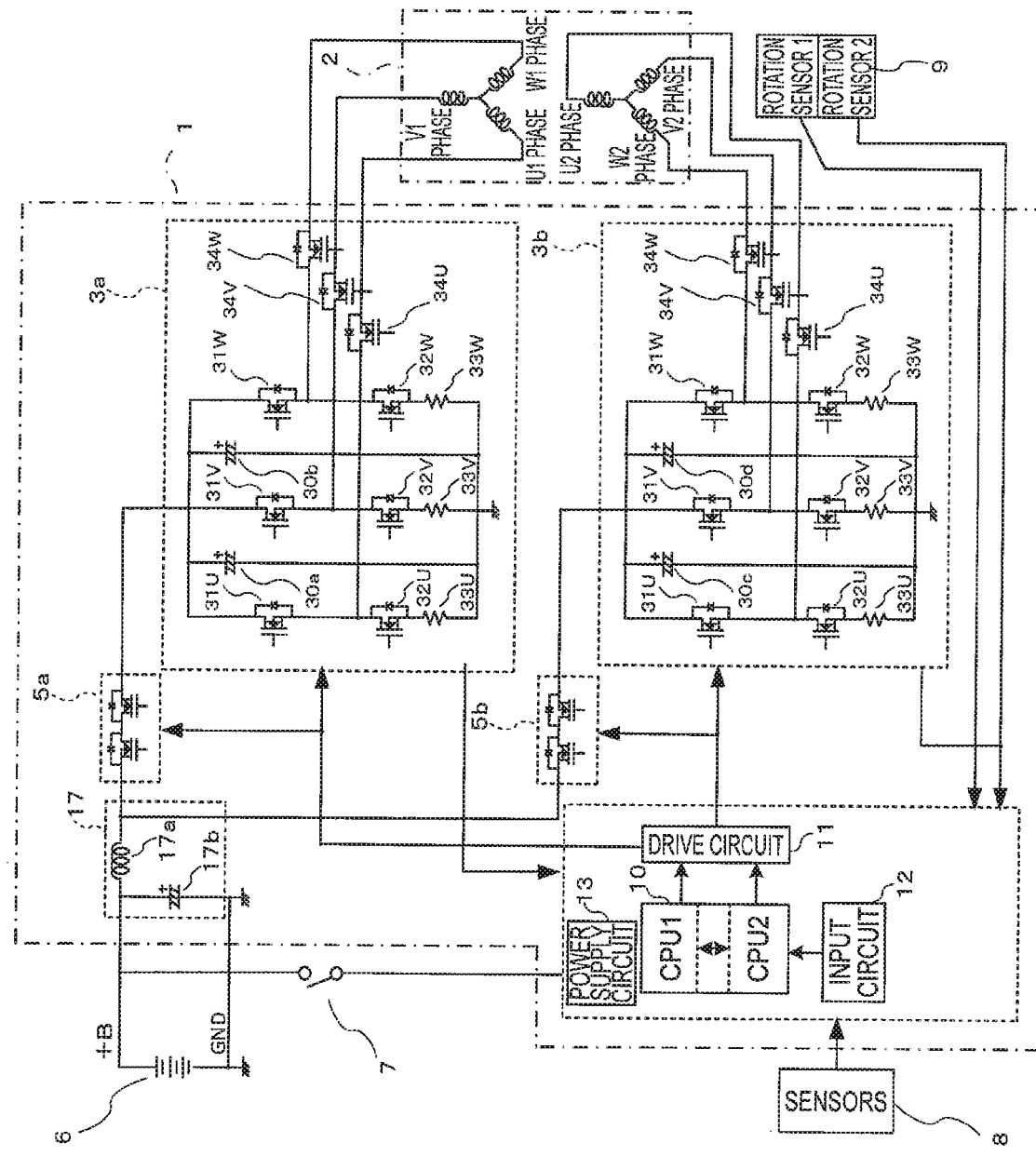
FIG. 11 is an overall circuit diagram for illustrating a circuit configuration of an integrated electric power steering apparatus according to a fourth embodiment of the present invention.
Figure 12:
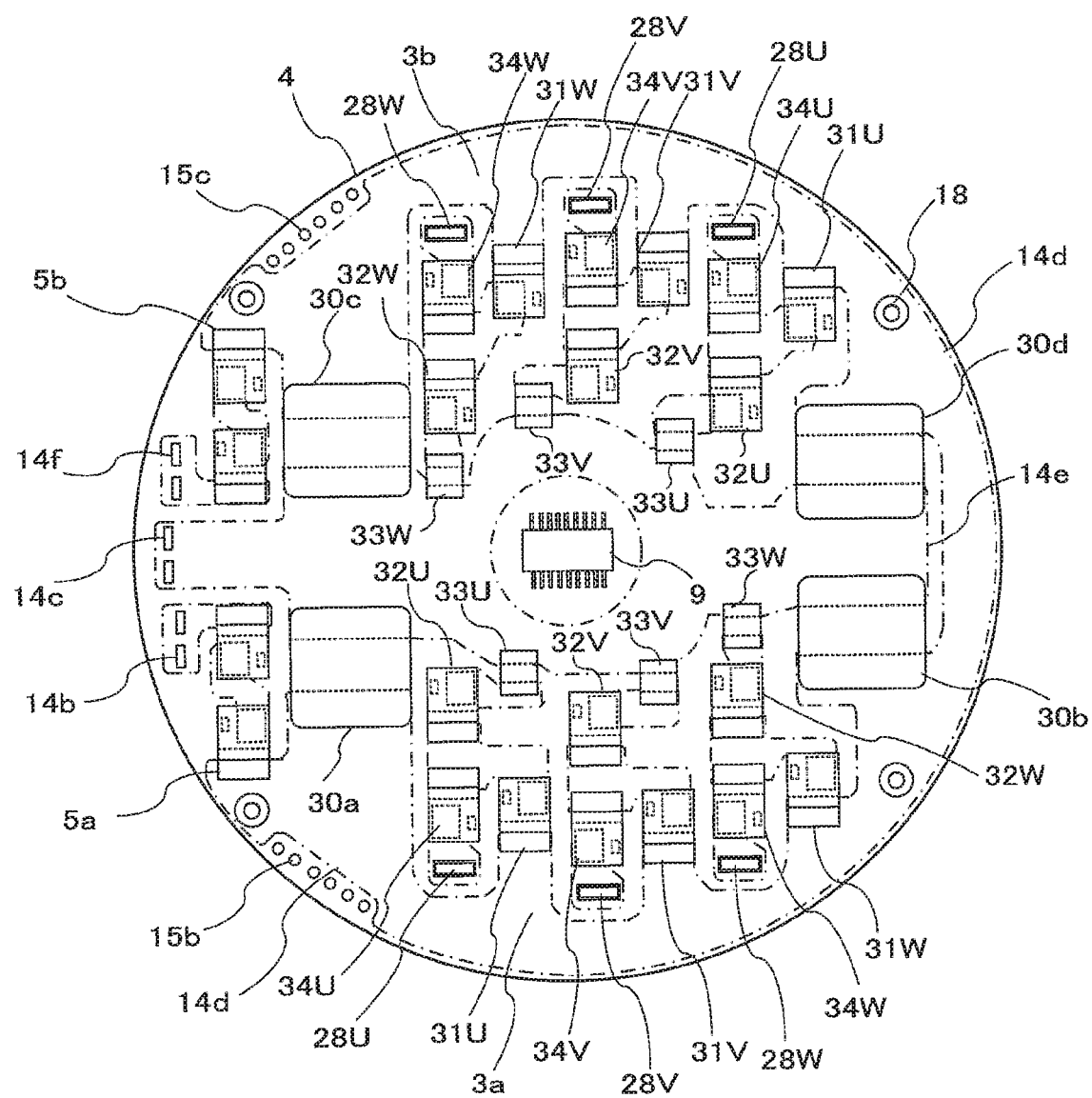
FIG. 12 is a plan view of a wiring board in the fourth embodiment of the present invention.

FIG. 11 is an overall circuit diagram for illustrating a circuit configuration of an integrated electric power steering apparatus according to the fourth embodiment of the present invention. FIG. 12 is a plan view of the wiring board 4 in the fourth embodiment of the present invention. In FIG. 11, the two inverter circuits 3 are denoted by the reference symbols 3a and 3b for distinction therebetween. Two sets of the switching elements 5 are denoted by the reference symbols 5a and 5b for distinction therebetween.

As is understood from FIG. 11, the integrated electric power steering apparatus according to the fourth embodiment is of type which requires two sets of the three-phase windings of the motor 2 in an independent manner. Further, as the capacitors 30, capacitors 30a to 3d are used. Further, the two inverter circuits 3 are required, and therefore the two drive circuits 11 are also required. In FIG. 11, the drive circuits 11 are illustrated collectively as a single drive circuit.

The CPU 10 may be a single CPU, or may be of a dual system made up of two CPUs. Further, the rotation sensors 9 are of a dual system made up of two rotation sensors.

Next, with reference to FIG. 12, the wiring board 4 in the fourth embodiment is described. In FIG. 12, the rotation sensors 9 are mounted in the center of the wiring board 4. On the outer periphery of the wiring board 4, two terminal holes 14f through which the +B-side wiring passes are formed in addition to the terminal holes 14b and the terminal holes 14c. The terminal holes 14c are sandwiched between the terminal holes 14b and the terminal holes 14f. The ground pattern 14e is formed on the central side of the wiring board 4 in an annular fashion so as to surround the rotation sensors 9 and extends from the annular portion toward the outer periphery of the wiring board 4.

The +B pattern 14d is formed so that the +B-side wiring passing through the terminal holes 14b and the switching elements 5a are connectable and the +B-side wiring passing through the terminal holes 14f and the switching elements 5b are connectable, and is formed along the outer periphery of the wiring board 4.

In the inverter circuit 3a, the inverter circuit components of the respective phases are mounted on the wiring board 4 in a concentrated manner. Similarly, in the inverter circuit 3b, the inverter circuit components of the respective phases are mounted on the wiring board 4 in a concentrated manner. The inverter circuit components respectively forming the inverter circuit 3a and the inverter circuit 3b are mounted separately with respect to a center line passing through the center of the wiring board 4 as a boundary.

The inverter circuit components of the respective phases are arranged between the +B pattern 14d and the ground pattern 14e. Therefore, the pattern lengths of the wiring patterns which connect the components with each other can be reduced to be the shortest.

In each of the inverter circuit 3a and the inverter circuit 3b, the winding end portions 28U, 28V, and 28W are soldered in a state of passing through the rectangular holes formed in the wiring board 4, in each of the inverter circuits 3a and the inverter circuit 3b, the winding end portions 28U, 28V, and 28W are arranged between the +B pattern 14d and the ground pattern 14e. Further, the winding end portions 28U, 28V, and 28W are arranged in a concentrated manner on an outer side of the inverter circuit components of the respective phases. Thus, the pattern lengths of the wiring patterns can be reduced to be the shortest.

Further, in order to suppress the noise mixed into the rotation sensors 9, the winding end portions 28 to be connected to the inverter circuit 3a and the winding end portions 28 to be connected to the inverter circuit 3b are arranged on the wiring board 4 so as to be point-symmetric with respect to the center of the wiring board 4 for the respective phases.

As described above, in the two sets of windings of the motor 2, first winding end portions to be connected to one of the inverter circuit 3a and the inverter circuit 3b and second winding end portions to be connected to another thereof are arranged on the wiring board 4 so as to be point-symmetric with respect to the center of the wiring board 4 for the respective phases.

The capacitors 30a, 30b, 30c, and 30d are arranged in the vicinity of the inverter circuits 3a and 3b and are also arranged between the +B pattern 14d and the ground pattern 14e. Therefore, the pattern lengths of the wiring patterns which connect the components described above can be reduced to be the shortest. Further, the various switching elements have the same height as the drain of the plate 31d made of copper as illustrated in FIG. 3 and FIG. 4, and are arranged in a concentrated manner in the respective phases. Therefore, the abutment against the projecting portion 29a provided on the frame 29 functioning as the heat sink is facilitated.

As described above, in contrast to the first to third embodiments described above, according to the fourth embodiment, the motor includes the two sets of the windings, and the control unit includes the two inverter circuits. The plurality of switching elements respectively forming the inverter circuits are mounted separately with respect to the central line passing through the center of the wiring board as the boundary.

In this manner, simplification of the arrangement of the various components mounted on the wiring board and simplification of the wirings are achieved, while the shortest pattern lengths of the wiring patterns are achieved. Further, when the thickness of the wiring patterns is set larger than that of the inner layer, a high current can be supplied. Further, the heat dissipation property of the patterns themselves is improved.

Further, in the fourth embodiment, the +B pattern 14d and the ground pattern 14e can be interchanged with each other. The high-current wiring pattern is formed on the front surface of the wiring board. Therefore, the back surface of the wiring board and the inner layers of the wiring board can be used for a control signal, for a low-current power supply, and for the ground. As a result, wiring efficiency can be prevented from being reduced.

Although the first to fourth embodiments have been individually described, the configuration examples disclosed in the first to fourth embodiments can be combined as desired.

The invention claimed is:

1. An integrated electric power steering apparatus, comprising:
   a motor;
   a rotation sensor to detect a rotation angle of the motor; and
   a control unit which is integrated with the motor, and is configured to control the motor,
   the control unit comprising:
      an inverter circuit which comprises a plurality of switching elements, and is configured to convert a direct current (DC) power supplied from a power supply into an alternating current (AC) power and to supply the converted AC power to the motor by controlling each of the plurality of switching elements;
      a central processing unit (CPU) configured to control each of the plurality of switching elements; and
      a wiring board on which the inverter circuit and the CPU are mounted, the wiring board comprising an inverter-circuit mounted surface on which the inverter circuit is mounted and an inverter-circuit non-mounted surface opposed to the inverter-circuit mounted surface,
   the wiring board comprising a positive-side wiring pattern configured to connect a positive side of the power supply and a positive side of the inverter circuit to each other and a negative-side wiring pattern configured to connect a negative side of the power supply and a negative side of the inverter circuit to each other, one of the positive-side wiring pattern and the negative-side wiring pattern being formed on a central side of the wiring board and another thereof being formed on an outer periphery side of the wiring board,
   the plurality of switching elements being mounted between the positive-side wiring pattern and the negative-side wiring pattern,
   the wiring board comprising a first layer on which the positive-side wiring pattern and the negative-side wiring pattern are mounted, and a second layer on which the positive-side wiring pattern and the negative-side wiring pattern are not mounted,
   the positive-side wiring pattern being formed to have an annular shape and surround the rotation sensor mounted at a center of the first layer of the wiring board on which the negative-side wiring pattern is mounted, and
   the positive-side wiring pattern and the negative-side wiring pattern being patterns that are thicker than patterns formed on the second layer of the wiring board on which the positive-side wiring pattern and the negative-side wiring pattern are not mounted.

2. The integrated electric power steering apparatus according to claim 1, wherein the rotation sensor is mounted to the inverter-circuit mounted surface,
- wherein the rotation sensor is surrounded by the positive-side wiring pattern and the negative-side wiring pattern, and the rotation sensor has an upper surface which is flush with an upper surface of the positive-side wiring pattern and an upper surface of the negative-side wiring pattern.

3. The integrated electric power steering apparatus according to claim 1, wherein the plurality of switching elements have head portions which are flush with each other.

4. The integrated electric power steering apparatus according to claim 1, further comprising:
- a motor case configured to accommodate the motor; and
- a frame, which is provided to the motor case, and is configured to separate the motor to be accommodated in the motor case and the control unit from each other and enable dissipation of heat generated from each of the plurality of switching elements,
- wherein the control unit is provided so that each of head portions of the plurality of switching elements is brought into contact with the frame.

5. The integrated electric power steering apparatus according to claim 4,
- wherein the frame is provided with a projecting portion which enables dissipation of the heat generated from each of the plurality of switching elements; and
- wherein the control unit is provided so that each of the head portions of the plurality of switching elements is brought into contact with the projecting portion provided to the frame.

6. The integrated electric power steering apparatus according to claim 1, further comprising a power supply system component, which is to be used for connection between the power supply and the inverter circuit, and is to be mounted on the inverter-circuit mounted surface or the inverter-circuit non-mounted surface.

7. The integrated electric power steering apparatus according to claim 1, wherein the CPU is mounted on the inverter-circuit mounted surface or the inverter-circuit non-mounted surface.

8. The integrated electric power steering apparatus according to claim 1, wherein winding end portions of windings of phases of the motor, which are to be connected to the inverter circuit, are arranged on the wiring board.

9. The integrated electric power steering apparatus according to claim 1,
- wherein the motor comprises two sets of windings;
- wherein the control unit comprises two inverter circuits; and
- wherein the plurality of switching elements forming the respective two inverter circuits are mounted in a separated manner with respect to a central line passing through a center of the wiring board as a boundary.

10. The integrated electric power steering apparatus according to claim 9, wherein a first winding end portion of the two sets of windings, which is to be connected to one of the two inverter circuits, and a second winding end portion to be connected to another of the two inverter circuits are arranged on the wiring board so as to be point-symmetric with respect to the center of the wiring board over the phases.

11. The integrated electric power steering apparatus according to claim 1,
- wherein the inverter circuit further comprises a capacitor, and
- wherein the capacitor is mounted across the one wiring pattern and the another wiring pattern.

12. The integrated electric power steering apparatus according to claim 1, wherein the positive-side wiring pattern is formed in parallel to the negative-side wiring pattern.

13. The integrated electric power steering apparatus according to claim 1, wherein the plurality of switching elements for each of a plurality of phases of the inverter circuits are oriented in a same direction.

* * * * *